(12) United States Patent
Kang

(10) Patent No.: US 7,684,269 B2
(45) Date of Patent: Mar. 23, 2010

(54) SEMICONDUCTOR MEMORY DEVICE

(75) Inventor: Khil-Ohk Kang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 5 days.

(21) Appl. No.: 11/967,582

(22) Filed: Dec. 31, 2007

(65) Prior Publication Data
US 2009/0003088 A1    Jan. 1, 2009

(30) Foreign Application Priority Data
Jun. 27, 2007  (KR) .................. 10-2007-0063718

(51) Int. Cl.
*G11C 29/00* (2006.01)

(52) U.S. Cl. ............. 365/201; 365/189.15; 365/189.08; 365/189.09; 365/189.03

(58) Field of Classification Search ............... 365/201, 365/189.15, 189.08, 189.09, 189.03
See application file for complete search history.

(56) References Cited

U.S. PATENT DOCUMENTS

| | | | | |
|---|---|---|---|---|
| 4,720,818 | A * | 1/1988 | Takeguchi | 365/201 |
| 5,212,442 | A * | 5/1993 | O'Toole et al. | 324/73.1 |
| 5,410,507 | A * | 4/1995 | Tazunoki et al. | 365/189.09 |
| 5,935,253 | A | 8/1999 | Conary et al. | |
| 6,184,720 | B1 * | 2/2001 | Kim et al. | 327/37 |
| 6,226,211 | B1 | 5/2001 | Kwak | |
| 6,399,357 | B1 * | 6/2002 | Winge | 435/239 |
| 6,473,344 | B2 * | 10/2002 | Kim et al. | 365/189.09 |
| 6,549,480 | B2 * | 4/2003 | Hosogane et al. | 365/226 |
| 6,597,187 | B2 * | 7/2003 | Eldridge et al. | 324/754 |
| 6,640,198 | B2 | 10/2003 | Miyazaki et al. | |
| 6,751,134 | B2 * | 6/2004 | Choi et al. | 365/189.11 |
| 6,757,857 | B2 | 6/2004 | Lamb et al. | |
| 7,102,413 | B2 * | 9/2006 | Kuroda | 327/408 |
| 7,126,326 | B2 * | 10/2006 | Muller | 324/158.1 |
| 7,308,624 | B2 * | 12/2007 | Versen et al. | 714/718 |
| 7,359,811 | B1 * | 4/2008 | Liu | 702/69 |
| 2004/0051553 | A1 | 3/2004 | Manna et al. | |
| 2006/0080058 | A1 | 4/2006 | Zimmerman et al. | |

FOREIGN PATENT DOCUMENTS

| | | |
|---|---|---|
| JP | 11-096795 | 4/1999 |
| JP | 2006-138662 | 6/2006 |
| KR | 1019990039586 | 6/1999 |
| KR | 1999-0061136 | 7/1999 |

OTHER PUBLICATIONS

Notice of Preliminary Rejection issued from Korean Intellectual Property Office on Jun. 30, 2008 with an English translation.
Notice of Allowance, Application No. 10-2007-0063718, issued from Korean Intellectual Property Office on Sep. 29, 2008.

* cited by examiner

*Primary Examiner*—Viet Q Nguyen
(74) *Attorney, Agent, or Firm*—IP & T Law Firm PLC

(57) ABSTRACT

A semiconductor memory device is capable of measuring internal voltages via a shared pad to reduce a chip size. The semiconductor memory device includes a selector and a monitoring pad. The selector is configured to select one of a plurality of internal signals in response to a test signal and output the selected internal signal. The monitoring pad is configured to output an output signal of the selector to an outside of the semiconductor memory device.

11 Claims, 6 Drawing Sheets

SEMICONDUCTOR MEMORY DEVICE

CROSS-REFERENCE TO RELATED APPLICATIONS

The present application claims priority to Korean patent application number 10-2007-0063718, filed on Jun. 27, 2007, which is incorporated by reference in its entirety.

BACKGROUND OF THE INVENTION

The present invention relates to semiconductor design technology, and more particularly to a pad of a semiconductor memory device for inputting/outputting a signal.

In general, semiconductor memory devices include contacts, e.g., pads, for inputting or outputting a variety of signals. Semiconductor memory devices must have predetermined number of pads at least that corresponds to number of kinds of various signals and external supply voltages, which are defined in a standard spec. Besides, semiconductor memory devices further include additional pads for a testing procedure generally. Thus, the additional pads are used for monitoring internally generated voltages of a semiconductor device or applying internal signals from the outside.

FIG. 1 is a block diagram illustrating the arrangement of banks and pads in a conventional semiconductor memory device.

Referring to FIG. 1, the conventional semiconductor memory device includes zeroth to third banks 72, 74, 76 and 78, a data pad unit 10, an internal voltage pad unit 20, a reference voltage pad unit 30, a command pad unit 40, an address pad unit 50, and a power supply pad unit 60. In each of the zeroth to third banks 72, 74, 76 and 78, a plurality of unit memory cells for storing data are arranged in an array form. The data pad unit 10 includes a plurality of pads configured to input/output the corresponding data. The internal voltage pad unit 20 includes a plurality of pads configured to output corresponding internal voltages. The reference voltage pad unit 30 includes a plurality of pads configured to input/output corresponding reference voltages. The command pad unit 40 includes a plurality of pads configured to receive corresponding commands. The address pad unit 50 includes a plurality of pads configured to receive corresponding addresses. The power supply pad 60 includes a plurality of pads configured to receive corresponding driving powers.

Such pads serve as interfaces configured to input/output commands, addresses, data and driving powers of a semiconductor memory device and to measure internal signals of the semiconductor memory device.

Herein, the pad units are disposed between the banks, i.e., between the zeroth and second banks 72 and 76 and between the first and third banks 74 and 78.

FIG. 2 is a block diagram illustrating connections between a voltage generator, the internal voltage pad unit 20 and the reference voltage pad unit 30 of FIG. 1.

Referring to FIG. 2, the conventional semiconductor memory device includes a reference voltage generator 80, an internal voltage generator 90, an internal voltage pad unit 20, a reference voltage pad unit 30, and an internal block 98. The reference voltage generator 80 generates first to fifth reference voltages VREFP, VREFC, VREFE, VREFB and VREFD. The internal voltage generator 90 receives the first to fifth reference voltages VREFP, VREFC, VREFE, VREFB and VREFD to generate corresponding internal voltages VPP, VCORE, VPERI, VBLP, VCP, VBB and VDLL. The internal voltage pad unit 20 includes a plurality of pads configured to output the corresponding internal voltages VPP, VCORE, VPERI, VBLP, VCP, VBB and VDLL. The reference voltage pad unit 30 includes a plurality of pads configured to input/output the first to fifth reference voltages VREFP, VREFC, VREFE, VREFB and VREFD from/to the outside. The internal block 98 is driven by receiving the output voltages VPP, VCORE, VPERI, VBLP, VCP, VBB and VDLL of the internal voltage generator 90.

As for its operation mechanism, the reference voltage generator 80 generates the first to fifth reference voltages VREFP, VREFC, VREFE, VREFB and VREFD. Subsequently, the internal voltage generator 90 receives the first to fifth reference voltages VREFP, VREFC, VREFE, VREFB and VREFD to generate the internal voltages VPP, VCORE, VPERI, VBLP, VCP, VBB and VDLL correspondingly.

Thereafter, each of the pads in the internal voltage pad unit 20 outputs one of the internal voltages VPP, VCORE, VPERI, VBLP, VCP, VBB and VDLL to the outside. Likewise, the pads in the reference voltage pad unit 30 inputs/outputs one of the first to fifth reference voltages VREFP, VREFC, VREFE, VREFB and VREFD from/to the outside. The internal block 98 is driven by receiving the output voltages VPP, VCORE, VPERI, VBLP, VCP, VBB and VDLL of the internal voltage generator 90.

In this manner, the conventional semiconductor memory device respectively includes a plurality of pads for inputting/outputting a plurality of reference voltages and a plurality of pads for outputting internal voltages. In the case where pads are provided for respective voltages, there is a problem in that a chip size must be increased due to a number of the pads.

SUMMARY OF THE INVENTION

Embodiments of the invention are directed to providing a semiconductor memory device for being capable of measuring internal voltages via a shared pad to reduce a chip size.

In one embodiment, a semiconductor memory device includes a selector configured to select one of a plurality of internal signals in response to a test signal and output the selected internal signal, and a monitoring pad configured to output an output signal of the selector to an outside of the semiconductor memory device.

In another embodiment, a semiconductor memory device includes a selector configured to select one of a plurality of internal voltages in response to test signals and output the selected internal voltage, and a monitoring pad configured to output an output voltage of the selector to an outside of the semiconductor memory device.

In still embodiment, a semiconductor memory device includes a reference voltage generator configured to generate a plurality of reference voltages, an internal voltage generator configured to receive the plurality of reference voltages to generate a plurality of internal voltages, a reference voltage pad unit including a plurality of pads configured to input/output a corresponding reference voltage of the plurality of reference voltages from/to an outside of the semiconductor memory device, a selector configured to select one of the plurality of internal voltages in response to test signals and output a selected internal voltage, a monitoring pad configured to output an output voltage of the selector to an outside of the semiconductor memory device, and a low voltage pad configured to output one of the plurality of internal voltages to the outside of the semiconductor memory device.

DESCRIPTION OF SPECIFIC EMBODIMENTS

Hereinafter, a semiconductor memory device in accordance with the invention will be described in detail with reference to the accompanying drawings.

Figure 3:
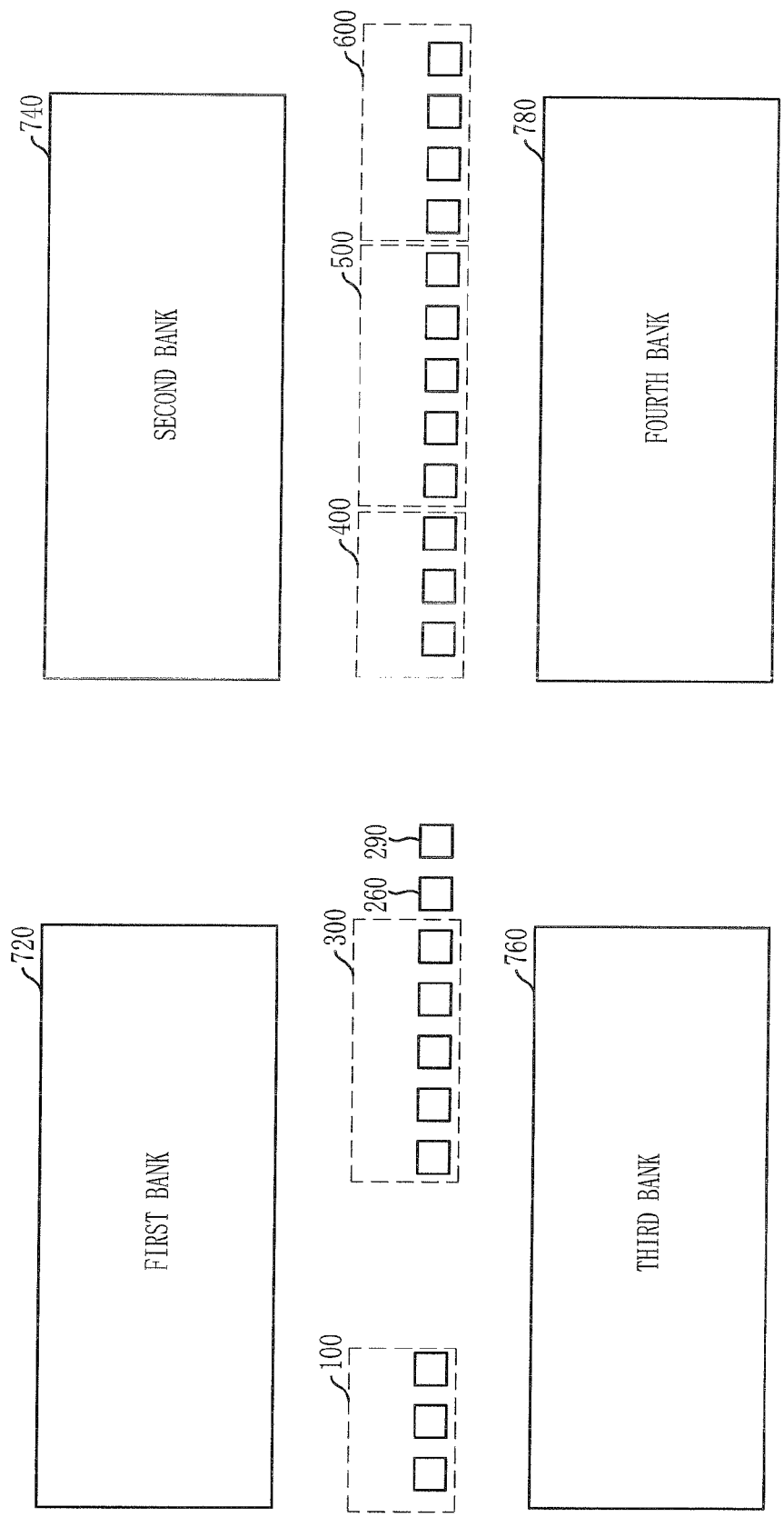
FIG. 3 is a block diagram illustrating the arrangement of banks and pads in a semiconductor memory device in accordance with an embodiment of the invention.

FIG. 3 is a block diagram illustrating the arrangement of banks and pads in a semiconductor memory device in accordance with an embodiment of the invention.

Referring to FIG. 3, the semiconductor memory device in accordance with the invention includes zeroth to third banks 720, 740, 760 and 780, a data pad unit 100, a low voltage pad 260, a monitoring pad 290, a reference voltage pad unit 300, a command pad unit 400, an address pad unit 500, and a power supply pad unit 600. In each of the zeroth to third banks 720, 740, 760 and 780, a plurality of unit memory cells for storing data are arranged in an array form. The data pad unit 100 includes a plurality of pads configured to input/output the corresponding data. The low voltage pad 260 is used for inputting/outputting a low voltage. The monitoring pad 290 is provided for outputting one selected from a plurality of internal voltages. The reference voltage pad unit 300 includes a plurality of pads configured to inputting/output corresponding reference voltages. The command pad unit 400 includes a plurality of pads configured to receive corresponding commands. The address pad unit 500 includes a plurality of pads configured to receive corresponding addresses. The power supply pad unit 600 includes a plurality of pads configured to receive corresponding driving powers.

Figure 1:
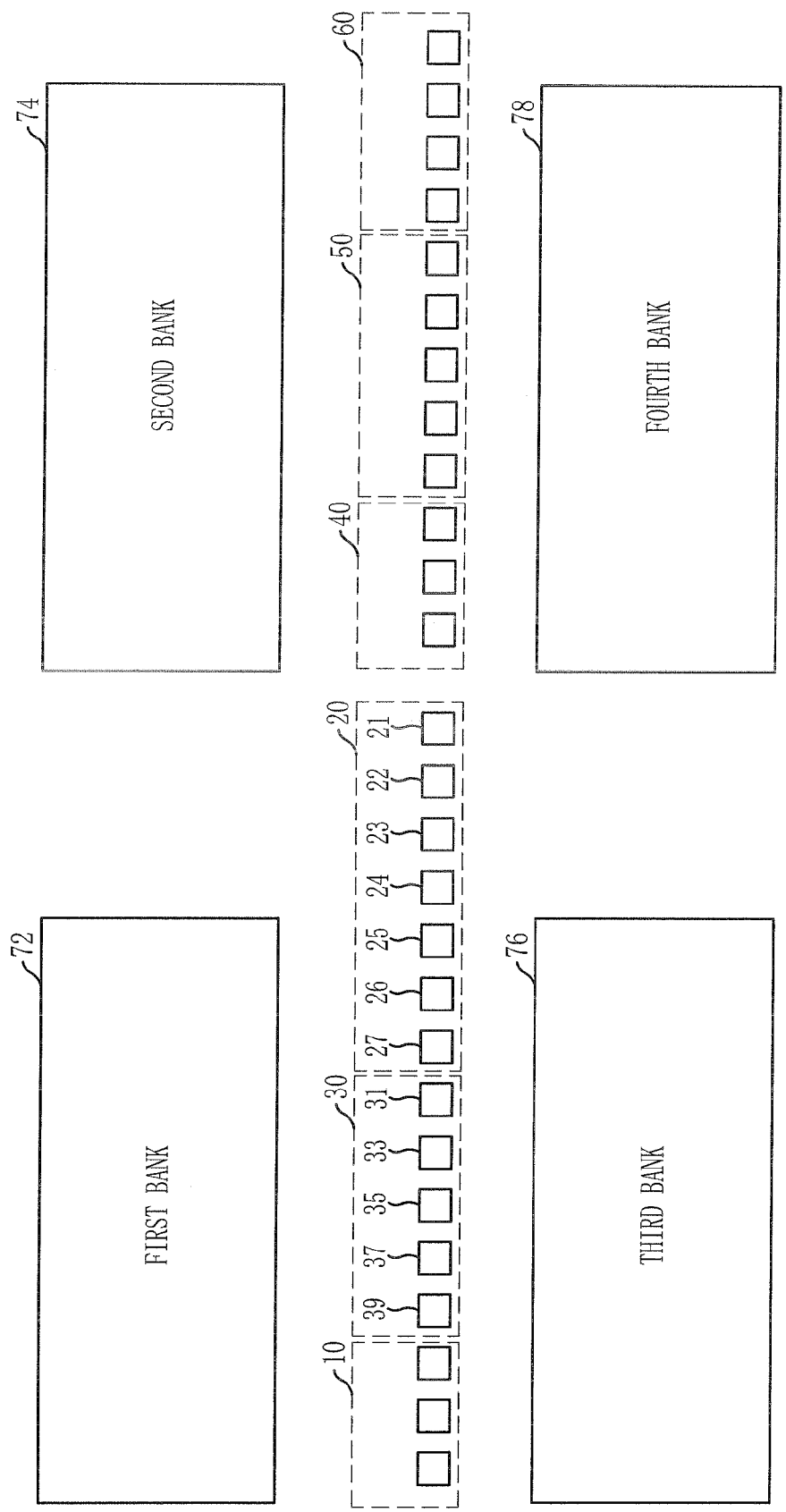
FIG. 1 is a block diagram illustrating the arrangement of banks and pads in a conventional semiconductor memory device.
Figure 2:
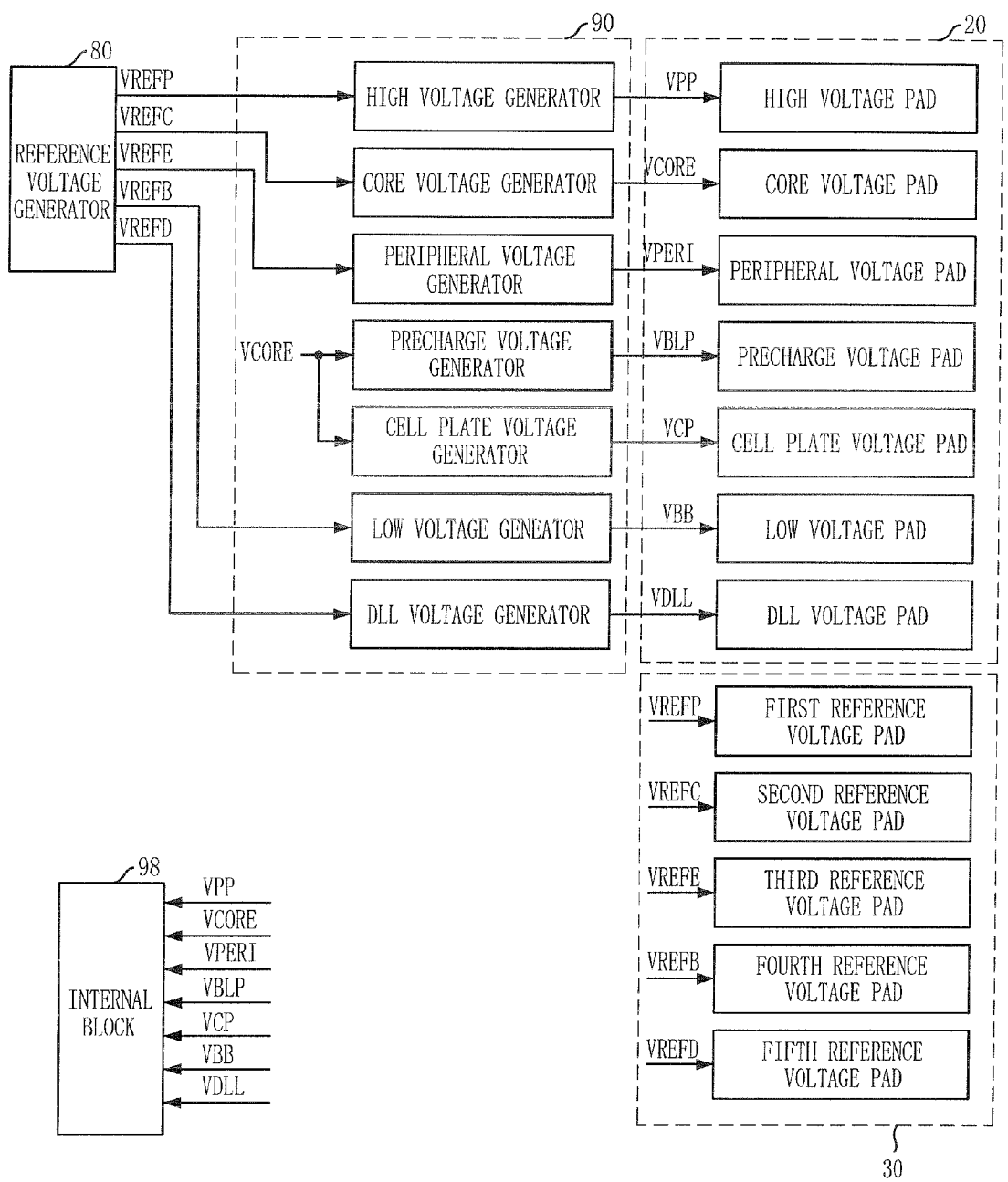
FIG. 2 is a block diagram illustrating connections between a voltage generator, an internal voltage pad unit and a reference voltage pad unit of FIG. 1.

As such, compared to the conventional semiconductor memory device of FIG. 1, it can be appreciated that the semiconductor memory device of the invention includes one monitoring pad 290 instead of the internal voltage pad unit (see 20 of FIG. 1). The reason is that the semiconductor memory device in accordance with the invention further includes a test signal generator 295 and a selector 280, thus controlling a plurality of internal voltages to be outputted via the shared monitoring pad 290 according to a test signal T0, T1 and T2. Accordingly, the semiconductor memory device of FIG. 3 can provide such an advantageous merit that it is possible to reduce the number of pads that were required to output desired voltages in the conventional semiconductor memory device because it is unnecessary to have a number of the pads corresponding to number of kinds of internal voltages in virtue of the shared pad.

Figure 4:
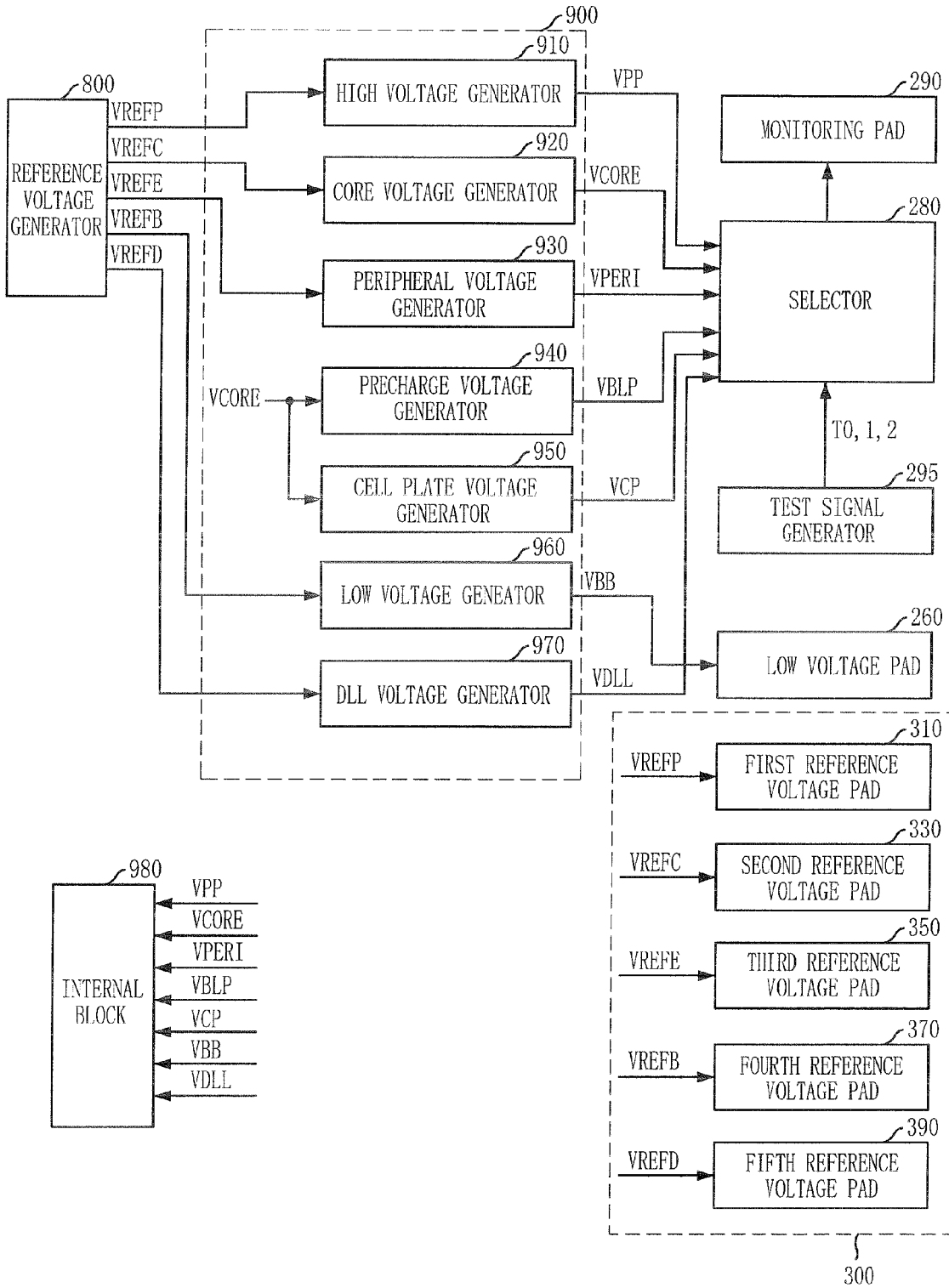
FIG. 4 is a block diagram illustrating connections between a voltage generator, a monitoring pad, a low voltage pad and a reference voltage pad unit of FIG. 3.

FIG. 4 is a block diagram illustrating connections between a voltage generator, the monitoring pad 290, the low voltage pad 260 and the reference voltage pad unit 300 of FIG. 3.

Referring to FIG. 4, the semiconductor memory device in accordance with the invention includes a reference voltage generator 800, an internal voltage generator 900, a test signal generator 295, a selector 280, a monitoring pad 290, a low voltage pad 260, a reference voltage pad unit 300, and an internal block 980. The reference voltage generator 800 generates first to fifth reference voltages VREFP, VREFC, VREFE, VREFB and VREFD. The internal voltage generator 900 receives the first to fifth reference voltages VREFP, VREFC, VREFE, VREFB and VREFD to generate corresponding internal voltages VPP, VCORE, VPERI, VBLP, VCP, VBB and VDLL. The test signal generator 295 generates test signals T0, T1 and T2. The selector 280 is responsive to the test signals T0, T1 and T2 to select one of the internal voltages VPP, VCORE, VPERI, VBLP, VCP and VDLL and outputs the selected internal voltage. The monitoring pad 290 is provided for outputting the output voltage of the selector 280 to the outside. The low voltage pad 260 is used for inputting/outputting a low voltage VBB of the internal voltages from/to the outside. The reference voltage pad unit 300 includes a plurality of pads configured to input/output the first to fifth reference voltages VREFP, VREFC, VREFE, VREFB and VREFD from/to the outside. The internal block 980 is driven by receiving the output voltages VPP, VCORE, VPERI, VBLP, VCP, VBB and VDLL of the internal voltage generator 900.

The internal voltage generator 900 includes a high voltage generator 910, a core voltage generator 920, a peripheral voltage generator 930, a precharge voltage generator 940, a cell plate voltage generator 950, a low voltage generator 960, and a delay locked loop (DLL) voltage generator 970. The high voltage generator 910 receives the first reference voltage VREFP to generate a high voltage VPP used in driving a word line. The core voltage generator 920 receives the second reference voltage VREFC to generate a core voltage VCORE used in applying data corresponding to logic value "1". The peripheral voltage generator 930 receives the third reference voltage VREFE to generate a peripheral voltage VPERI used in driving a peripheral region. The precharge voltage generator 940 receives the core voltage VCORE to generate a precharge voltage VBLP used in precharging a bit line. The cell plate voltage generator 950 receives the core voltage VCORE to generate a cell plate voltage VCP used for a plate of a capacitor in a memory cell. The low voltage generator 960 receives the fourth reference voltage VREFB to generate the low voltage VBB applied to a substrate terminal of a transistor. The DLL voltage generator 970 receives the fifth reference voltage VREFD to generate a DLL voltage VDLL used in driving a DLL.

As for an operation mechanism, the reference voltage generator 800 generates the first to fifth reference voltages VREFP, VREFC, VREFE, VREFB and VREFD. Here, the first reference voltage VREFP is used as a reference voltage in generating the high voltage VPP, and the second reference voltage VREFC is used as a reference voltage in generating the core voltage VCORE. The third reference voltage VREFE, the fourth reference voltage VREFB and the fifth reference voltage VREFD are used as reference voltages in generating the peripheral voltage VPERI, the low voltage VBB and the DLL voltage VDLL, respectively.

The internal voltage generator 900 receives the first to fifth reference voltages VREFP, VREFC, VREFE, VREFB and VREFD to generate the internal voltages VPP, VCORE, VPERI, VBLP, VCP, VBB and VDLL correspondingly. Specifically, the high voltage generator 910 receives the first reference voltage VREFP to generate the high voltage VPP used in driving a word line. The core voltage generator 920 receives the second reference voltage VREFC to generate the core voltage VCORE used in applying data corresponding to logic value "1". The peripheral voltage generator 930 receives the third reference voltage VREFE to generate the peripheral voltage VPERI used in driving a peripheral region. The precharge voltage generator 940 receives the core voltage VCORE to generate the precharge voltage VBLP used in precharging a bit line. The cell plate voltage generator 950 receives the core voltage VCORE to generate the cell plate voltage VCP used for a plate of a capacitor in a memory cell. The low voltage generator 960 receives the fourth reference voltage VREFB to generate the low voltage VBB applied to a substrate terminal of a transistor. The DLL voltage generator 970 receives the fifth reference voltage VREFD to generate the DLL voltage VDLL used in driving a DLL.

The test signal generator 295 generates the test signals T0, T1 and T2. The selector 280 selects one of the internal voltages VPP, VCORE, VPERI, VBLP, VCP and VDLL in response to the test signals T0, T1 and T2 and then outputs the selected internal voltage to the monitoring pad 290.

The reference voltage pad unit 300 inputs/outputs the first to the fifth reference voltages VREFP, VREFC, VREFE, VREFB and VREFD from/to the outside. The internal block 980 is driven by receiving the output voltages VPP, VCORE, VPERI, VBLP, VCP, VBB and VDLL of the internal voltage generator 900.

In this manner, the semiconductor memory device in accordance with the invention includes a monitoring pad for measuring an internal voltage, and thus one of a plurality of internal voltages is selectively measured via the monitoring pad. While the pads should be provided for each of the plurality of internal voltages in the conventional semiconductor memory device, the pad is shared by several internal voltages, thus reducing the number of the pads in the invention. Sharing of the pads with a plurality of voltages will be more fully described later with reference to the accompanying drawings. That is, the selector 280 will be illustrated in detail with reference to its internal circuit diagram.

Figure 5:
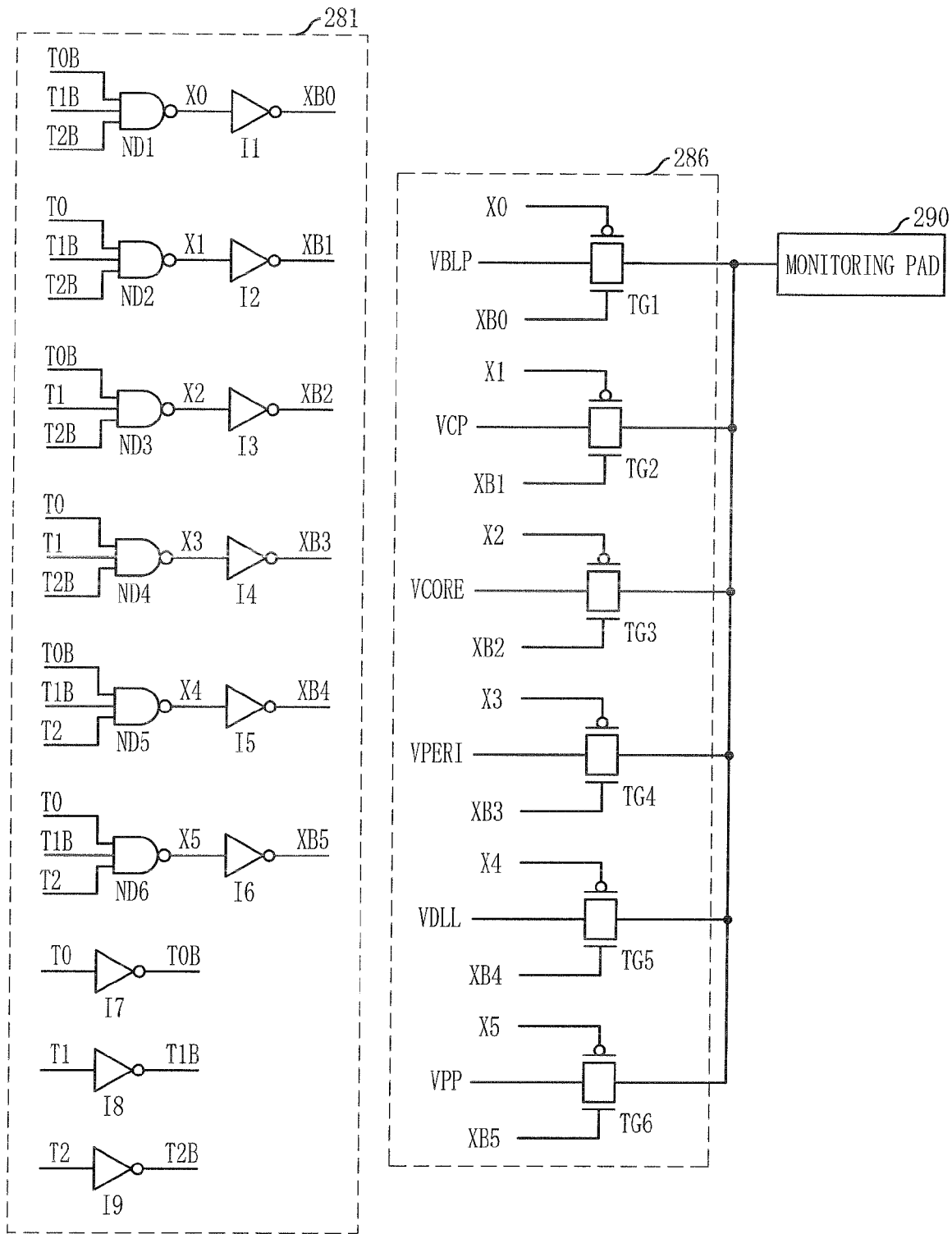
FIG. 5 illustrates a schematic circuit diagram of a selector of FIG. 4.

FIG. 5 illustrates a schematic circuit diagram of the selector 280 of FIG. 4.

Referring to FIG. 5, the selector 280 includes a decoding unit 281 configured to decode the test signals T0, T1 and T2 to generate a plurality of select signals X0~X5 and a plurality of select bar signals XB0~XB5, and a transfer unit 286 configured to output corresponding internal voltages VPP, VCORE, VPERI, VBLP, VCP, VBB and VDLL to the monitoring pad 290 in response to the corresponding select signals X0~X5 and select bar signals XB0~XB5.

The decoding unit 281 includes an inverter I7 configured to invert the first test signal T0 to output a first test bar signal T0B, an inverter I8 configured to invert the second test signal T1 to output a second test bar signal T1B, an inverter I9 configured to invert the third test signal T2 to output a third test bar signal T2B, a plurality of NAND gates ND1~ND6, and a plurality of inverters I1~I6. The first NAND gate ND1 performs a NAND operation on the outputs of the inverters I7, I8 and I9, i.e., the first to third test bar signals T0B, T1B and T2B, to thereby output the first select signal X0. The first inverter I1 inverts the first select signal X0 to output the first select bar signal XB0. The second NAND gate ND2 performs a NAND operation on the first test signal T0 and the second and third test bar signals T1B and T2B to output the second select signal X1. The second inverter I2 inverts the second select signal X1 to output the second select bar signal XB1. The third NAND gate ND3 performs a NAND operation on the second test signal T1 and the first and third test bar signals T0B and T2B to output the third select signal X2. The third inverter I3 inverts the third select signal X2 to output the third select bar signal XB2. The fourth NAND gate ND4 performs a NAND operation on the first and second test signals T0 and T1 and the third test bar signal T2B to output the fourth select signal X3. The fourth inverter I4 inverts the fourth select signal X3 to output the fourth select bar signal XB3. The fifth NAND gate ND5 performs a NAND operation on the third test signal T2 and the first and second test bar signals T0B and T1B to output the fifth select signal X4. The fifth inverter I5 inverts the fifth select signal X4 to output the fifth select bar signal XB4. The sixth NAND gate ND6 performs a NAND operation on the first and third test signals T0 and T2 and the second test bar signal T1B to output the sixth select signal X5. The sixth inverter I6 inverts the sixth select signal X5 to output the sixth select bar signal XB5.

The transfer unit includes a plurality of transfer gates TG1~TG6. The first transfer gate TG1 transfers the precharge voltage VBLP in response to the first select signal X0 and the first select bar signal XB0. The second transfer gate TG2 transfers the cell plate voltage VCP in response to the second select signal X1 and the second select bar signal XB1. The third transfer gate TG3 transfers the core voltage VCORE in response to the third select signal X2 and the third select bar signal XB2. The fourth transfer gate TG4 transfers the peripheral voltage VPERI in response to the fourth select signal X3 and the fourth select bar signal XB3. The fifth transfer gate TG5 transfers the DLL voltage VDLL in response to the fifth select signal X4 and the fifth select bar signal XB4. The sixth transfer gate TG6 transfers the high voltage VPP in response to the sixth select signal X5 and the sixth select bar signal XB5.

An operation mechanism of the selector 280 will be described below.

First, the decoding unit 281 activates a corresponding signal among the select signals X0~X5 according to the combination of the test signals T0, T1 and T2. The transfer unit 286 selects a corresponding internal voltage in response to the activation of the select signals X0~X5, and then outputs the selected internal voltage to the monitoring pad 290. Exemplarily, the specific cases where the precharge voltage VBLP and the cell plate voltage VCP are selected respectively will be explained below.

For example, it is assumed that the test signal generator 295 outputs the test signals T0, T1 and T2 of logic low levels. The decoding unit 281 activates the first select signal X0 to a logic low level and the first select bar signal XB0 to a logic high level in response to the test signals T0, T1 and T2 of logic low levels. Subsequently, the first transfer gate TG1 in the transfer unit 286 outputs the precharge voltage VBLP in response to the activation of the first select signal X0 and the first select bar signal XB0 so that the precharge voltage VBLP is outputted to the outside via the monitoring pad 290.

When the first test signal T0 has a logic high level and the second and third test signals T1 and T2 have logic low levels, the decoding unit 281 activates the second select signal X1 to a logic low level and the second select bar signal XB1 to a logic high level, respectively, in response to the logic levels of the test signals T0, T1 and T2. Thereafter, the second transfer gate TF2 in the transfer unit 286 outputs the cell plate voltage VCP in response to the activations of the second select signal X1 and the second select bar signal XB1 so that the cell plate voltage VCP is outputted to the outside via the monitoring pad 290.

Figure 6:
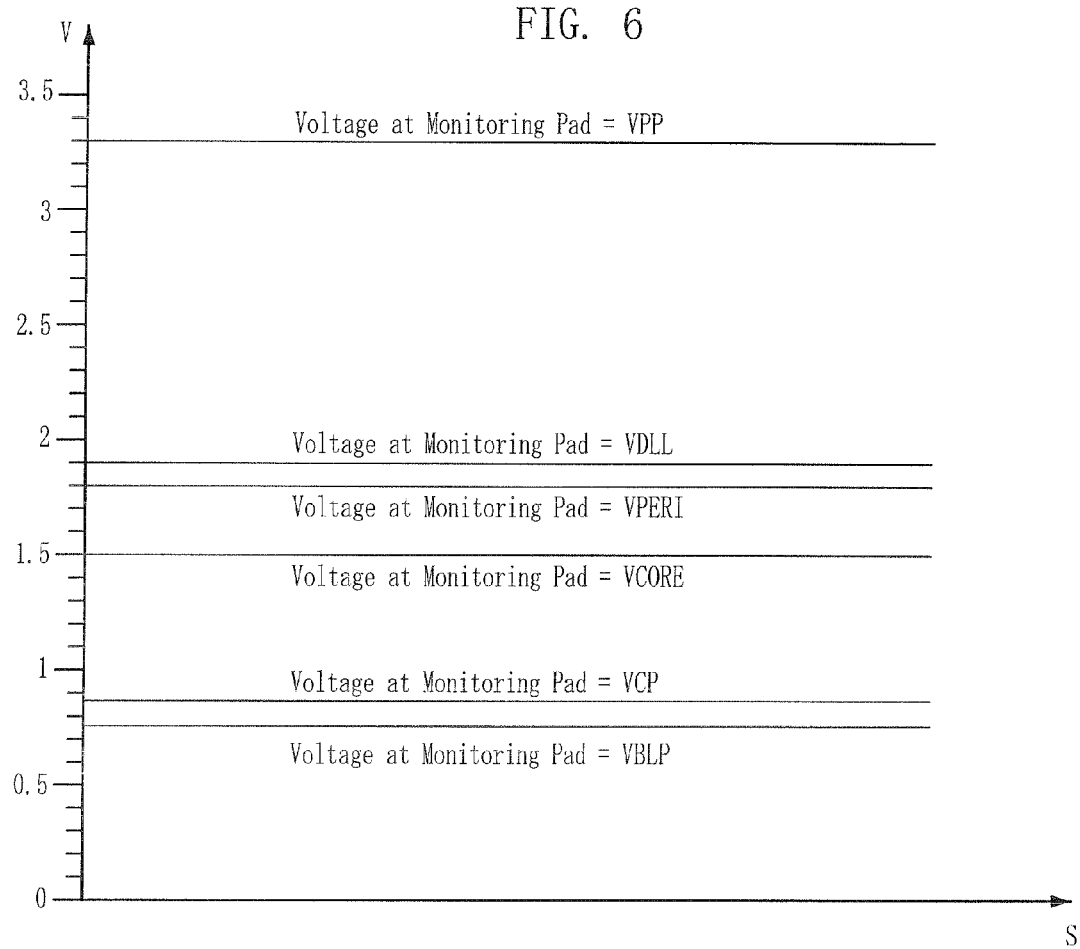
FIG. 6 is a simulation graph illustrating voltage levels measured via the monitoring pad in the semiconductor memory device in accordance with the invention.

FIG. 6 is a simulation graph illustrating voltage levels measured via the monitoring pad in the semiconductor memory device in accordance with the invention.

Referring to FIG. 6, when the selector 280 selects the high voltage VPP and outputs it, an approximately 3.3 volts of level, i.e., a high voltage level, is measured at the monitoring pad 290. When the DLL voltage VDLL is selected, an approximately 1.9 volts of level, i.e., a DLL voltage level, is measured at the monitoring pad 290. When the peripheral voltage VPERI is selected, an approximately 1.8 volts of level, i.e., a peripheral voltage level, is measured at the monitoring pad 290. When the core voltage VCORE is selected, an approximately 1.5 volts of level, i.e., a core voltage level, is measured at the monitoring pad 290. When the cell plate voltage VCP is selected, an approximately 0.85 volts of level, i.e., a cell plate voltage level, is measured at the monitoring pad 290. When the precharge voltage VBLP is selected, an approximately 0.75 volts of level, i.e., a precharge voltage level, is measured at the monitoring pad 290.

As stated above, the semiconductor memory device in accordance with the invention further includes the test signal generator 295 and the selector 280 compared to the conventional semiconductor memory device. Accordingly, the plurality of internal voltages VPP, VCORE, VPERI, VBLP, VCP and VDLL share one monitoring pad 290. Only one internal voltage among them is selected by the test signal T0, T1 and T2 and it can be then outputted through the shared monitoring pad 290. This makes it possible to reduce number of pads and an occupation area of the pads, thus reducing a total cost.

Meanwhile, the number of pads in each pad unit is merely exemplified for convenience in description, which does not limit the scope of the invention.

In addition, although it was exemplarily illustrated that the plurality of internal voltages share one monitoring pad in the embodiment, they may share one or more monitoring pads, which also reduces a chip size in comparison with the conventional art.

Furthermore, though only a plurality of internal voltages is illustrated in the embodiment, the invention can be also applied to internal signals necessary to be measured at the outside.

As described above, in accordance with the invention, it is possible to reduce number of pads, chip size, and cost by controlling a plurality of voltages necessary to be measured at the outside to be outputted through a shared pad in response to test signals.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a selector configured to select one of a plurality of internal voltages in response to at least one test signals and output the selected internal voltage;
    a monitoring pad configured to output an output voltage of the selector to an outside of the semiconductor memory device;
    a reference voltage generator configured to generate a plurality of reference voltages;
    an internal voltage generator configured to receive the plurality of reference voltages to generate the plurality of internal voltages; and
    a reference voltage pad unit including a plurality of pads configured to input/output a corresponding reference voltage of the plurality of reference voltages from/to the outside of the semiconductor memory device,
    wherein the selector includes:
        a decoding unit configured to decode the at least one test signal to generate a plurality of select signals; and
        a transfer unit configured to output a corresponding internal voltage to the monitoring pad in response to the plurality of the select signals.

2. The semiconductor memory device of claim 1, wherein the selector includes:
    a decoding unit configured to decode the at least one the test signal to generate a plurality of select signals; and
    a transfer unit configured to output one of the plurality of internal voltages to the monitoring pad in response to the plurality of the select signals.

3. The semiconductor memory device of claim 2, wherein the transfer unit includes:
    a first transfer gate configured to transfer a first internal voltage in response to a first select signal; and
    a second transfer gate configured to transfer a second internal voltage in response to a second select signal.

4. The semiconductor memory device of claim 1, wherein the transfer unit includes a transfer gate configured to transfer a first internal voltage in response to a first select signal.

5. The semiconductor memory device of claim 4, wherein the internal voltage generator includes:
    a first internal voltage generator configured to receive a first reference voltage to generate a first internal voltage to drive a word line;
    a second internal voltage generator configured to receive a second reference voltage to generate a second internal voltage used in applying data corresponding to a logic value "1";
    a third internal voltage generator configured to receive a third reference voltage to generate a third internal voltage to drive a peripheral region;
    a fourth internal voltage generator configured to receive the third internal voltage to generate a fourth internal voltage to precharge a bit line;
    a fifth internal voltage generator configured to receive the third internal voltage to generate a fifth internal voltage applied to a plate of a capacitor in a memory cell;
    a sixth internal voltage generator configured to receive a fourth reference voltage to generate a sixth internal voltage applied to a substrate terminal of a transistor; and
    a seventh internal voltage generator configured to receive a fifth reference voltage to generate a seventh internal voltage to drive a delay locked loop (DLL).

6. The semiconductor memory device of claim 5, wherein the decoding unit includes:
    a first inverter configured to invert a first test signal;
    a second inverter configured to invert a second test signal;
    a third inverter configured to invert a third test signal;
    a NAND gate configured to perform a NAND operation on outputs of the first, second and third inverters to output the first select signal; and
    a fourth inverter configured to invert an output of the NAND gate to output a first select bar signal.

7. A semiconductor memory device, comprising:
    a reference voltage generator configured to generate a plurality of reference voltages;
    an internal voltage generator configured to receive the plurality of reference voltages to generate a plurality of internal voltages;
    a reference voltage pad unit including a plurality of pads configured to input/output a corresponding reference voltage of the plurality of reference voltages from/to an outside of the semiconductor memory device;
    a selector configured to select one of the plurality of internal voltages in response to test signals and output a selected internal voltage;
    a monitoring pad configured to output an output voltage of the selector to the outside of the semiconductor memory device; and
    a low voltage pad configured to output one of the plurality of internal voltages to the outside of the semiconductor memory device.

8. The semiconductor memory device as recited in claim 7, wherein the selector includes:
- a decoding unit configured to decode the test signals to generate a plurality of select signals; and
- a transfer unit configured to output a corresponding internal voltage to the monitoring pad in response to the plurality of the select signals.

9. The semiconductor memory device as recited in claim 8, wherein the transfer unit includes a transfer gate configured to transfer a first internal voltage in response to a first select signal.

10. The semiconductor memory device as recited in claim 9, further comprising a test signal generator configured to generate first to third test signals.

11. The semiconductor memory device as recited in claim 10, wherein the decoding unit includes:
- a first inverter configured to invert the first test signal;
- a second inverter configured to invert the second test signal;
- a third inverter configured to invert the third test signal;
- a NAND gate configured to perform a NAND operation on outputs of the first, second and third inverters to output the first select signal; and
- a fourth inverter configured to invert an output of the NAND gate to output a first select bar signal.

* * * * *